US012656395B2

(12) United States Patent     (10) Patent No.:   US 12,656,395 B2

Wu et al.     (45) Date of Patent:   *Jun. 16, 2026

(54) CIRCUIT SCREENING SYSTEM AND CIRCUIT SCREENING METHOD

(71) Applicant: TAIWAN SEMICONDUCTOR MANUFACTURING COMPANY LTD., Hsinchu (TW)

(72) Inventors: Chi-Che Wu, Hsinchu (TW); Tsung-Yang Hung, Hsinchu County (TW); Jia-Ming Guo, Hsinchu (TW); Yi-Na Fang, Hsinchu (TW); Ming-Yih Wang, Hsin-Chu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/518,629

(22) Filed: Nov. 24, 2023

(65) Prior Publication Data

US 2024/0094288 A1     Mar. 21, 2024

Related U.S. Application Data

(63) Continuation of application No. 18/055,365, filed on Nov. 14, 2022, now Pat. No. 11,852,682, which is a continuation of application No. 17/114,330, filed on Dec. 7, 2020, now Pat. No. 11,500,016.

(51) Int. Cl.
*G01R 31/317*     (2006.01)

(52) U.S. Cl.
CPC . *G01R 31/31725* (2013.01); *G01R 31/31721* (2013.01)

(58) Field of Classification Search
CPC ........ G01R 31/31725; G01R 31/31721; G01R 31/3004; G01R 31/31727; G01R 31/2879; G01R 31/31712; G01R 31/3183
USPC ........................................ 324/76.82
See application file for complete search history.

(56) References Cited

U.S. PATENT DOCUMENTS 9,435,862 B2 *   9/2016   Litovchenko .... G01R 31/31721
2005/0040858 A1 *   2/2005   Naffziger ................. H03K 5/06
    326/95
2007/0025487 A1 *   2/2007   Chiba ....................... H03L 7/06
    375/372

(Continued)

FOREIGN PATENT DOCUMENTS

CN     102124357 A   *   7/2011   ....... G01R 31/31725
CN     111983432 A   *   11/2020   ......... G01R 31/2879

*Primary Examiner* — Arleen M Vazquez
*Assistant Examiner* — Robert P Alejnikov, Jr.
(74) *Attorney, Agent, or Firm* — WPAT LAW; Anthony King

(57) ABSTRACT

A circuit screening system including a target circuit under test receiving a first testing signal in a first period and a second testing signal in a second period; and a clock generating circuit providing a clock signal to the target circuit under test, the clock signal triggering the target circuit under test to receive the first testing signal in the first period and the second testing signal in the second period; the clock signal having a first profile and a second profile in the first period and the second period, respectively, and the first profile and the second profile having a phase difference.

20 Claims, 12 Drawing Sheets

(56)         References Cited

U.S. PATENT DOCUMENTS

| | | | |
|---|---|---|---|
| 2009/0051396 A1* | 2/2009 | Shimamoto | H03K 5/135 |
| | | | 324/76.62 |
| 2010/0140938 A1* | 6/2010 | Cook | F03D 7/047 |
| | | | 290/44 |
| 2012/0092038 A1* | 4/2012 | Fujimoto | G06F 1/24 |
| | | | 324/762.03 |
| 2013/0200931 A1* | 8/2013 | Kono | H03H 11/16 |
| | | | 327/147 |
| 2022/0193414 A1* | 6/2022 | Waataja | A61N 1/36053 |

* cited by examiner

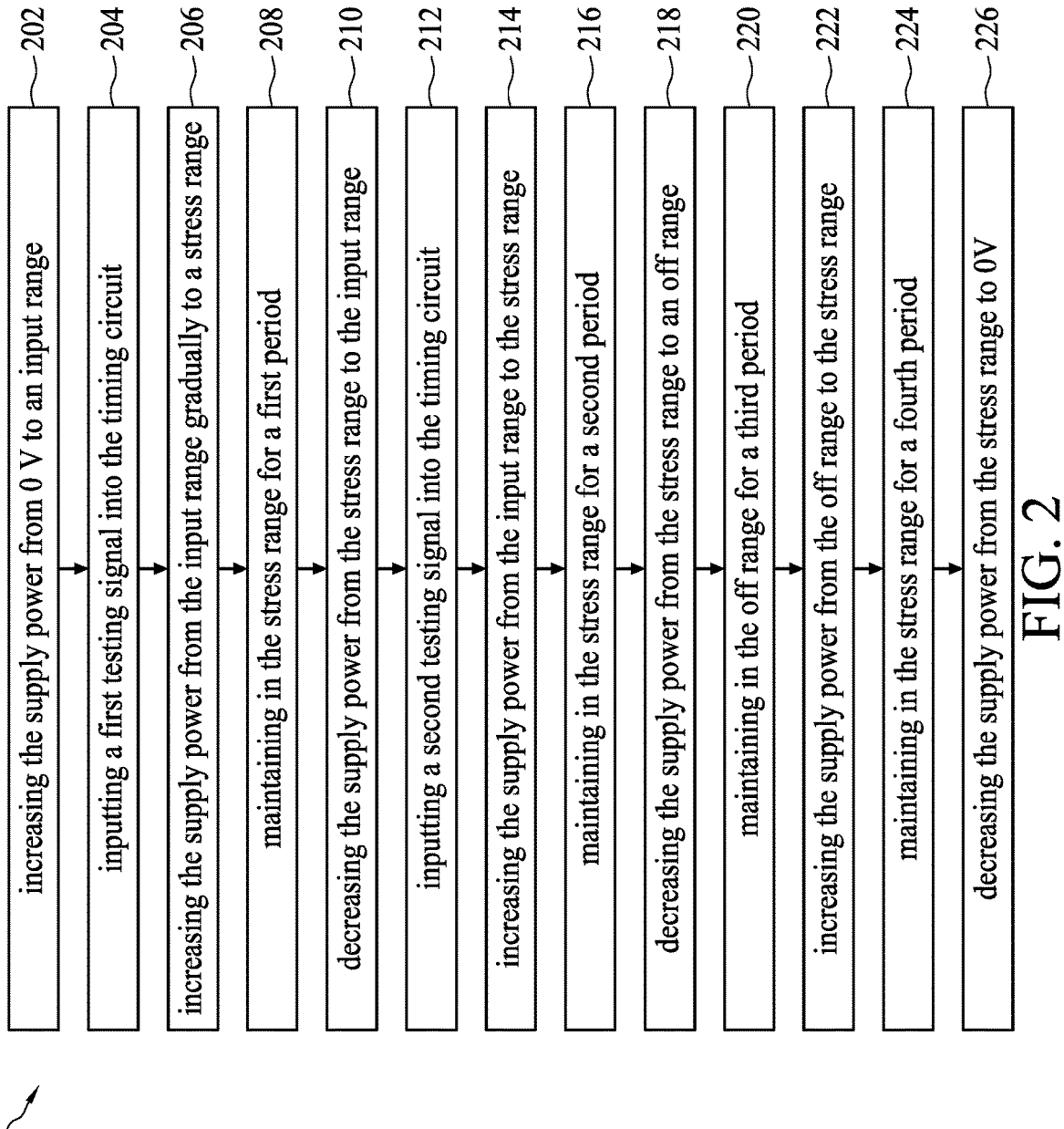

increasing the supply power from 0 V to an input range ~202 inputting a first testing signal into the timing circuit ~204 increasing the supply power from the input range gradually to a stress range ~206 maintaining in the stress range for a first period ~208 decreasing the supply power from the stress range to the input range ~210 inputting a second testing signal into the timing circuit ~212 increasing the supply power from the input range to the stress range ~214 maintaining in the stress range for a second period ~216 decreasing the supply power from the stress range to an off range ~218 maintaining in the off range for a third period ~220 increasing the supply power from the off range to the stress range ~222 maintaining in the stress range for a fourth period ~224 decreasing the supply power from the stress range to 0V ~226

CIRCUIT SCREENING SYSTEM AND CIRCUIT SCREENING METHOD

CROSS-REFERENCE TO RELATED APPLICATION

This application is a continuation of U.S. application Ser. No. 18/055,365, field on Nov. 14 2022, which is a continuation of U.S. application Ser. No. 17/114,330, field on Dec. 7 2020, which application is hereby incorporated herein by reference.

BACKGROUND

During the semiconductor fabrication process, a wafer needs to undergo numerous manufacturing processes to form integrated circuits. In wafer acceptance testing, integrated circuits need to be tested in order to determine the performance and reliability of the integrated circuits. The reliability test is often used to screen early-life failures in the manufacturing process of integrated circuits. In general, the reliability test tests integrated circuits by various different techniques, such as techniques of power loop on/off and applying voltage exceeding normal working conditions. However, current testing techniques cannot effectively test the reliability of integrated circuits under each operating state. Moreover, current testing techniques require extensive testing time, which certainly severely delays the manufacturing progress of integrated circuits.

BRIEF DESCRIPTION OF THE DRAWINGS

FIG. 2 is a flowchart of a circuit screening method performed on a target circuit under test by the circuit screening system according to an embodiment of the present disclosure;

DETAILED DESCRIPTION

Figure 1:
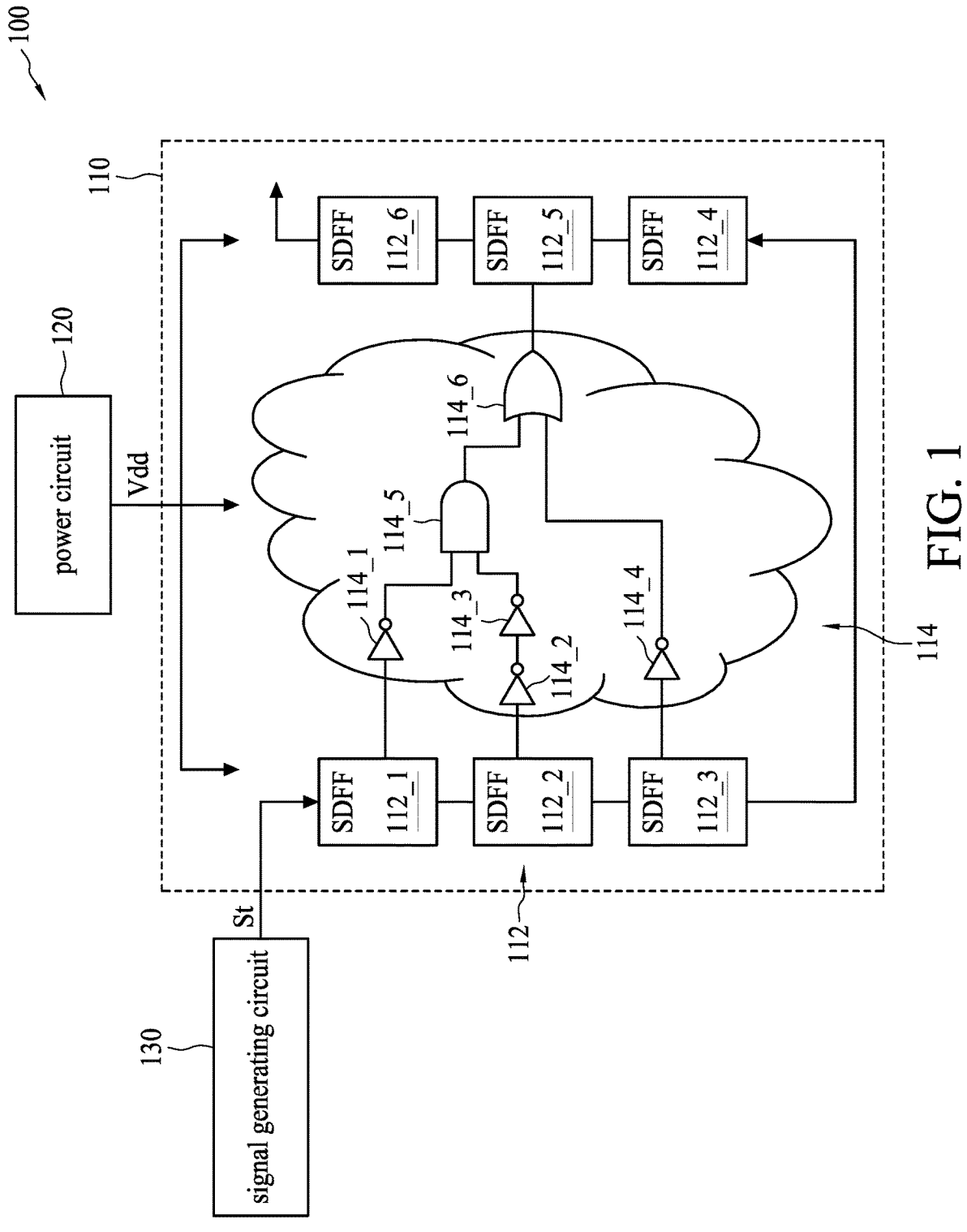
FIG. 1 is a schematic diagram of a circuit screening system according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 shows a schematic diagram of a circuit screening system 100 according to an embodiment of the present disclosure. The circuit screening system 100 includes a target circuit under test 110, a power circuit 120 and a signal generating circuit 130. The target circuit under test 110 is coupled to the power circuit 120 and the signal generating circuit 130. The power circuit 120 is configured to generate and provide a supply power Vdd to the target circuit under test 110, wherein a voltage level of the supply power Vdd is adjustable. The signal generating circuit 130 is configured to generate and provide a testing signal St to the target circuit under test 110.

The target circuit under test 110 includes a timing circuit 112 and a combinational logic circuit 114. The timing circuit 112 includes a plurality of cascaded flip-flops 112_1 to 112_6. In other words, among the plurality of cascaded flip-flops 112_1 to 112_6, the signal output terminal of one flip-flop (e.g., 112_1) is connected to the signal input terminal of the next flip-flop (e.g., 112_2). In one embodiment, the plurality of flip-flops 112_1 to 112_6 may be consisted of a plurality of scan D flip-flops (SDFFs). The combinational logic circuit 114 includes a cluster of logic circuits coupled to the timing circuit 112. In some embodiments of the present disclosure, the cluster of logic circuits include a plurality of logic circuits 114_1 to 114_6, wherein the plurality of logic circuits 114_1 to 114_6 are configured to be electrically connected to all or a part of the flip-flops 112_1 to 112_6, so as to receive or output signals of the corresponding flip-flops. For example, in FIG. 1, the logic circuits 114_1, 114_2 and 114_4 are for receiving the output signals of the flip-flops 112_1, 112_2 and 112_3, respectively, and the logic circuit 114_6 is for outputting a signal to the flip-flop 112_5.

It should be noted that, the number and connection means of the logic circuits 114_1 to 114_6 are examples only, and are not to be construed as a limiting condition of the present disclosure. Similarly, the number and connection means of the plurality of flip-flops 112_1 to 112_6 are examples only, and are not to be construed as a limiting condition of the present disclosure. It should be noted that, the circuit screening system 100 in FIG. 1 may further include a control circuit (not shown in FIG. 1) configured to control operations between the power circuit 120 and the signal generating circuit 130.

FIG. 2 shows a flowchart of a circuit screening method 200 performed on the target circuit under test 110 by the circuit screening system 100 according to an embodiment of the present disclosure. The circuit screening method 200 is a quasi-dynamic enhanced voltage stress (EVS) testing method. The circuit screening method 200 includes steps 202 to 226. In step 202, the supply power Vdd increases from 0 V and locates in an input range. The input range covers voltage levels that enable the transistors in the combinational logic circuit 114 to operate normally. In some embodiments of the present disclosure, the input range ranges from a low normal voltage level Vnom,low to a top normal voltage level Vnom,top. In some embodiments of the present disclosure, the low normal voltage level Vnom,low is about 0.8 times a normal voltage level Vnom, and the top normal voltage level Vnom,top is about 1.2 times the normal voltage level Vnom.

In step 204, the signal generating circuit 130 inputs a first testing signal St1 into the timing circuit 112. In step 206, the supply power Vdd is gradually increased from the input range to a stress range. The stress range covers voltage levels that possibly make the transistor in the combinational logic circuit 114 to breakdown. In some embodiments of the present disclosure, the stress range ranges from a low stress voltage level Vstress,low to a top stress voltage level Vstress,top. In some embodiments of the present disclosure, the low stress voltage level Vstress,low is about 0.8 times a stress voltage level Vstress, and the top normal voltage level Vstress,top is about 1.2 times the stress voltage level Vstress.

In step 208, the supply power Vdd is maintained in the stress range for a first period to so as to perform high-voltage testing on the target circuit under test 110. In step 210, the supply power Vdd decreases from the stress range to the input range. In step 212, the signal generating circuit 130 inputs a second testing signal St2 into the timing circuit 112. In step 214, the supply power Vdd increases from the input range to the stress range. In step 216, the supply power Vdd is maintained in the stress range for a second period tb so as to perform high-voltage testing on the target circuit under test 110. In step 218, the supply power Vdd decreases from the stress range to an off range. The off range covers voltage levels that possibly make the transistor in the combinational logic circuit 114 turn off. In some embodiments of the present disclosure, the off stage ranges from a low off voltage level Voff,low to a top off voltage off voltage level Voff,top. In some embodiments of the present disclosure, the low off voltage level Voff,low is 0.8 times an off voltage level Voff, and the top off voltage level Voff,top is 1.2 times the off voltage level Voff. In step 220, the supply power Vdd is maintained in an off range for a third period tc. In step 222, the supply power Vdd increases from the off range to the stress range. In step 224, the supply power Vdd is maintained in the stress range for a fourth period td so as to perform high-voltage testing on the target circuit under test 110. In step 226, the supply power Vdd decreases from the stress range to 0 V.

Figure 3:
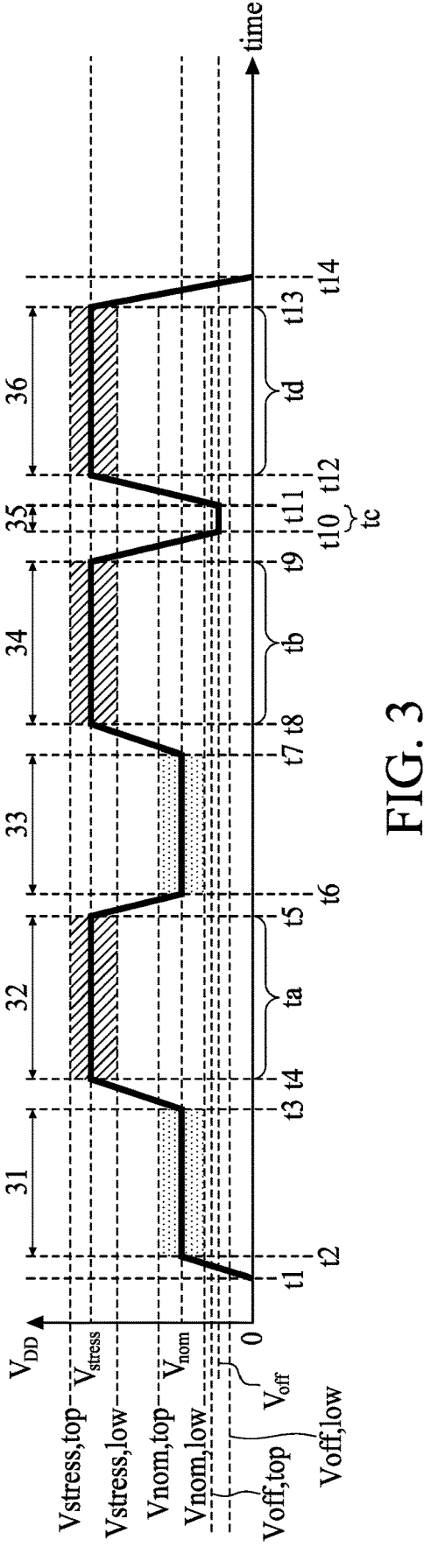
FIG. 3 is a timing diagram of the circuit screening method performed on the target circuit under test by the circuit screening system according to an embodiment of the present disclosure.

FIG. 3 further illustrates detailed features of the circuit screening method 200 of the present disclosure. FIG. 3 shows a timing diagram of the circuit screening method 200 performed on the target circuit under test 110 by the circuit screening system 100 according to an embodiment of the present disclosure. At a time point t1, i.e., step 202, the supply power Vdd gradually increases from 0 V to input range.

At a time point t2 corresponding to step 204, the signal generating circuit 130 inputs the first testing signal St1 into the timing circuit 112. It should be noted that, before the first testing signal St1 is inputted into the timing circuit 112, the signal generating circuit 130 inputs an initial signal Si into the timing circuit 112 so as to set initial states of circuit components in the target circuit under test 110.

Figures 4A, 4B:
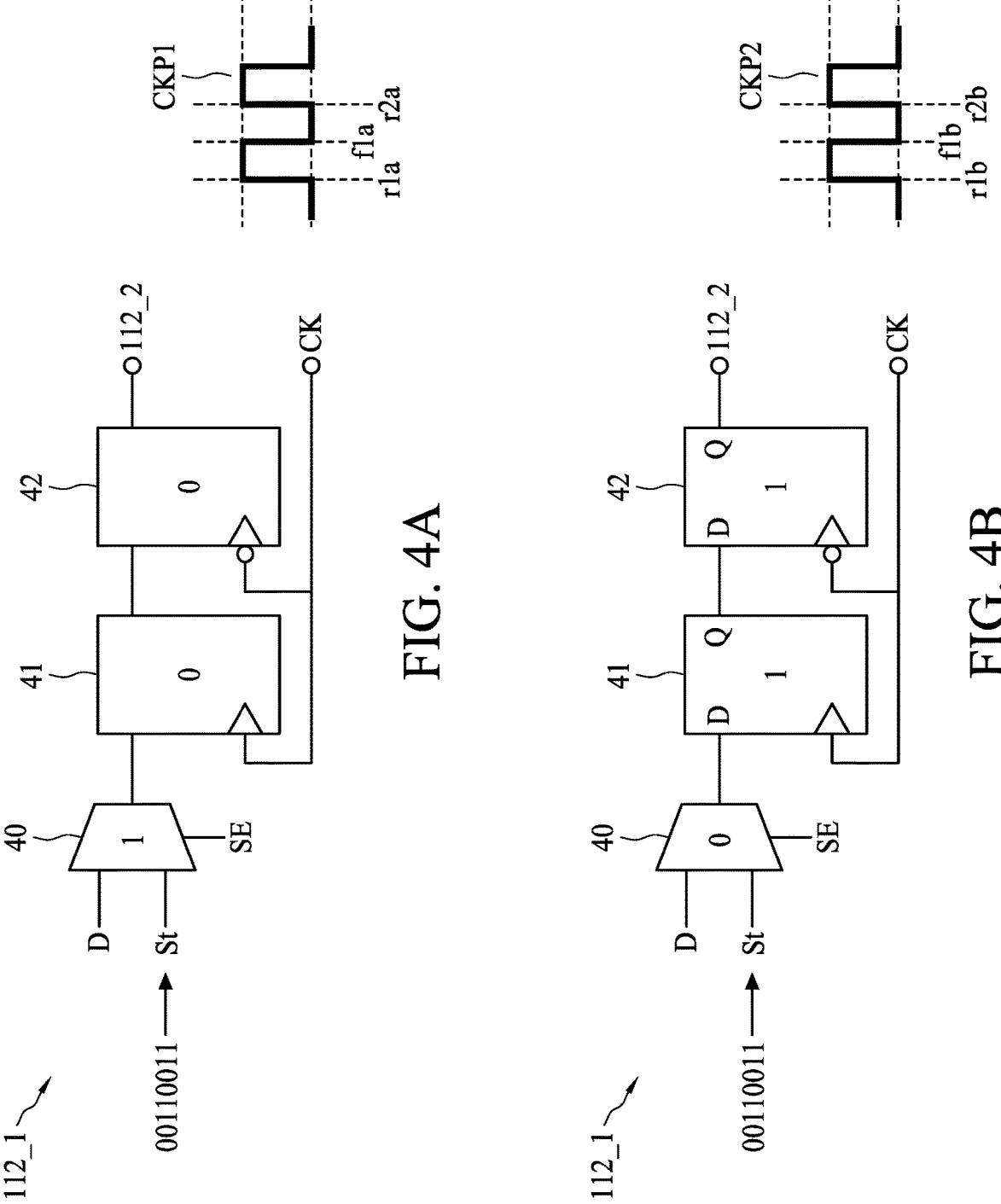
FIG. 4A is a diagram illustrating inputting a first testing signal in a timing circuit in accordance with an embodiment of the present disclosure.
FIGS. 4B to 4E are diagrams illustrating inputting a second testing signal in a timing circuit in accordance with an embodiment of the present disclosure.

FIG. 4A is a diagram illustrating inputting the first testing signal St1 in the timing circuit 112 in accordance with an embodiment of the present disclosure. In FIG. 4A, only the flip-flop 112_1 is shown for example. Those skilled in the art should readily how to expand the shown embodiment of FIG. 4A for the flip-flops 112_1 to 112_6. The flip-flop 112_1 includes a buffer stage 40, a latch 41 and a latch 42. The input terminal of the latch 42 is coupled to the output terminal of the latch 41. The output terminal of the latch 42 is coupled to the input terminal of the flip-flip 112_2. The latches 41 and 42 are triggered by a clock signal CK. In some embodiments of the present disclosure, the latch 41 is triggered by the rising edge of the clock signal CK while the latch 42 is triggered by the falling edge of the clock signal CK. In some embodiments of the present disclosure, the clock signal CK is provided by a clock generating circuit (not shown).

In the embodiment of FIG. 4A, a buffer stage 40 is coupled to the input terminal of the latch 41. In some embodiments of the present disclosure, the buffer stage 40 is implemented by a multiplexer, and an input terminal of the multiplexer receives the testing signal generated by the testing signal St.

In the embodiment of FIG. 4A, the digital data of the testing signal St is [00110011], and the testing signal St is inputted into the target circuit under test 110 as the first testing signal St1. At the time point t2, the clock signal CK is transmitted to the testing circuit 112. The clock signal CK has a first profile CKP1 including a plurality of integrated pulses. Specifically, the first profile CKP1 starts with the logic low value then rises to the logic high value, and repeats. When a first rising edge r1a of the clock signal CK is received by the latch 41, the first bit '0' of the testing signal St is stored in the latch 41. When a first falling edge f1a of the clock signal CK is received by the latch 42, the first bit '0' of the testing signal St is transferred to the latch 42 from the latch 41. When a second rising edge r2a of the clock signal CK is received by the latch 41, the second bit '0' of the testing signal St is stored in the latch 41. Meanwhile, the first bit '0' stored in the latch 42 is transferred to the flip-flop 112_2.

Those skilled in the art should understand that when the sixth pulse of the clock signal CK is received by the flip-flops 112_1 to 112_6, the first six bit of the testing signal St is stored in the flip-flops 112_1 to 112_6 as the first testing signal St1. Specifically, the first bit '0' of the testing signal St is stored in the flip-flop 112_6, the second bit '0' of the testing signal St is stored in the flip-flop 112_5, the third bit '1' of the testing signal St is stored in the flip-flop 112_4, the fourth bit '1' of the testing signal St is stored in the flip-flop 112_3, the fifth bit '0' of the testing signal St is stored in the flip-flop 112_2, and the sixth bit '0' of the testing signal St is stored in the flip-flop 112_1.

Referring back to FIG. 3, at a time point t3 corresponding to step 206, the power circuit 120 gradually increases the supply power Vdd from the input range (e.g., the normal voltage level Vnom) to the stress range (e.g., the high voltage level Vstress). In one embodiment, the high voltage level Vstress is between one and three times of the normal voltage level Vnom. In the present disclosure, the time period from the time point t2 to the time point t3 is considered as a first input stage 31.

At a time point t4 corresponding to step 208, the power circuit 120 maintains the voltage level Vstress for the first period ta so as to perform high-voltage testing on the target circuit under test 110. In the present disclosure, the first period ta is also considered as a first stress stage 32.

At a time point t5 corresponding to step 210, the power circuit 210 gradually decreases the supply power Vdd from the stress range (e.g., the high voltage level Vstress) to the input range (e.g., the normal voltage level Vnom).

At a time point t6 corresponding to step 212, the signal generating circuit 130 inputs the second testing signal St2 into the timing circuit 112. In one embodiment, the second testing signal St2 is a complementary signal of the first testing signal St1. Further, the first testing signal St1 stored in the timing circuit 112 in the time point t2 includes the first set of digital data [001100], and the second testing signal St2 includes a second set of digital data, wherein the logic levels of individual units of digital data in the second set of digital data are all opposite to the logic levels of corresponding individual units of digital data in the first set of digital data. It should be noted that, the logic levels of individual units of digital data in the second set of digital data may also be partially opposite to the logic levels of corresponding individual units of digital data in the first set of the digital data.

When the second testing signal St2 is a complementary signal of the first testing signal St1, the signal generating circuit 130 does not need to again input a complete second testing signal St2 into the timing circuit 112, and the signal generating circuit 130 only needs to input a shift signal Sf into the timing circuit 112. Further, the shift signal Sf shifts the data in the timing circuit 112 by a predetermined number of cycles, such that the first testing signal St1 in the timing circuit 112 is directly updated to the second testing signal St2.

FIG. 4B is a diagram illustrating inputting the second testing signal St2 into the timing circuit 112 in accordance with an embodiment of the present disclosure. Following by the embodiment of FIG. 4A, after the first testing signal St1, whose digital data is [001100], is stored in the flip-flops 112_1 to 112_6, the target circuit under test 110 keeps receiving the testing signal St as the shift signal Sf. At the time point t6, the clock signal CK is transmitted to the timing circuit 112. The clock signal CK has a second profile CKP2 which is identical to the first profile CKP1.

When a first rising edge r1b of the clock signal CK is received by the latch 41, the seventh bit '1' of the testing signal St is stored in the latch 41. When a first falling edge f1b of the clock signal CK is received by the latch 42, the seventh bit '1' of the testing signal St is transferred to the latch 42 from the latch 41. When a second rising edge r2b of the clock signal CK is received by the latch 41, the eighth bit '1' of the testing signal St is stored in the latch 41. Meanwhile, the seventh bit '1' stored in the latch 42 is transferred to the flip-flop 112_2. By receiving two pulses of the clock signal CK, the data bits stored in the flip-flops 112_1 to 112_6 are '1', '1', '0', '0', '1', '1', respectively, and form the digital data [110011] of the second testing signal St2, which is a complementary signal of the first testing signal St1.

Figures 4C, 4D:
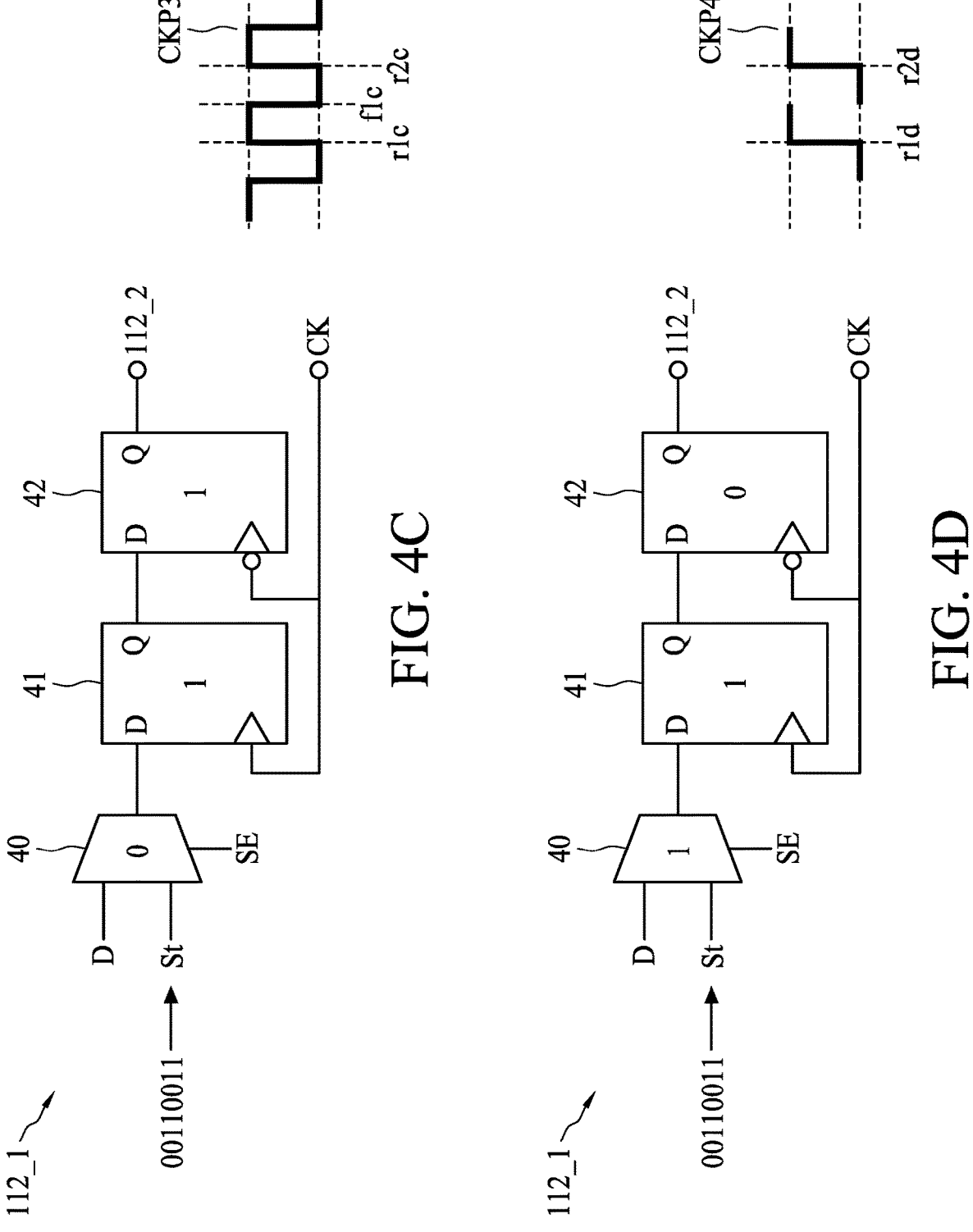

FIG. 4C is a diagram illustrating inputting the second testing signal St2 into the timing circuit 112 in accordance with an embodiment of the present disclosure. Following by the embodiment of FIG. 4A, after the first testing signal St1, whose digital data is [001100], is stored in the flip-flops 112_1 to 112_6, the target circuit under test 110 keeps receiving the testing signal St as the shift signal Sf. At the time point t6, the clock signal CK is transmitted to the timing circuit 112. The clock signal CK has a third profile CKP3 which is different from the first profile CKP1. The third profile CKP3 starts with the logic high value then falls to the logic low value, and repeats. Those skilled should understand that the profile CKP3 is a reverse waveform to the profile CKP1, that is, a phase difference between the profile CKP3 and the profile CKP1 are 90 degrees.

Specifically, when a first rising edge r1c of the clock signal CK is received by the latch 41, the seventh bit '1' of the testing signal St is stored in the latch 41. When a first falling edge f1c of the clock signal CK is received by the latch 42, the seventh bit '1' of the testing signal St is transferred to the latch 42 from the latch 41. When a second rising edge r2c of the clock signal CK is received by the flip-flop 112_1, the eighth bit '1' of the testing signal St is stored in the latch 41. Meanwhile, the seventh bit '1' stored in the latch 42 is transferred to the flip-flop 112_2. By receiving two pulses of the clock signal CK, the data bits stored in the flip-flops 112_1 to 112_6 are '1', '1', '0', '0', '1', '1', respectively, and form the digital data [110011] of the second testing signal St2, which is a complementary signal of the first testing signal St1.

It should be noted that in the embodiment of FIG. 4C, the phase difference between the profiles CKP3 and CKP1 are 90 degrees, which makes the profiles CKP3 and CKP1 complementary. However, those skilled in the art should understand that the phase difference between the profiles CKP3 and CKP1 should not be limited to 90 degrees.

FIG. 4D is a diagram illustrating inputting the second testing signal St2 into the timing circuit 112 in accordance with an embodiment of the present disclosure. Following by the embodiment of FIG. 4A, after the first testing signal St1, whose digital data is [001100], is stored in the flip-flops 112_1 to 112_6, the target circuit under test 110 keeps receiving the testing signal St as the shift signal Sf. At the time point t6, the clock signal CK is transmitted to the timing circuit 112. The clock signal CK has a fourth profile CKP4 including a plurality of half pulses, which is different from the first profile CKP1. Specifically, the fourth profile CKP4 starts with the logic low value then rises to the logic high value, and stops. That is, the clock signal CK excludes a falling edge in the fourth profile CKP4.

When a first rising edge r1d of the clock signal CK is received by the latch 41, the seventh bit '1' of the testing signal St is stored in the latch 41. Meanwhile, the bit '0' stored in the latch 42 is transferred to the flip-flip 112_2. When a second rising edge r2d of the clock signal CK is received by the latch 41112_1, the eighth bit '1' of the testing signal St is stored in the latch 41. Meanwhile, the bit '0' stored in the latch 42 is transferred to the flip-flip 112_2.

Figure 4E:
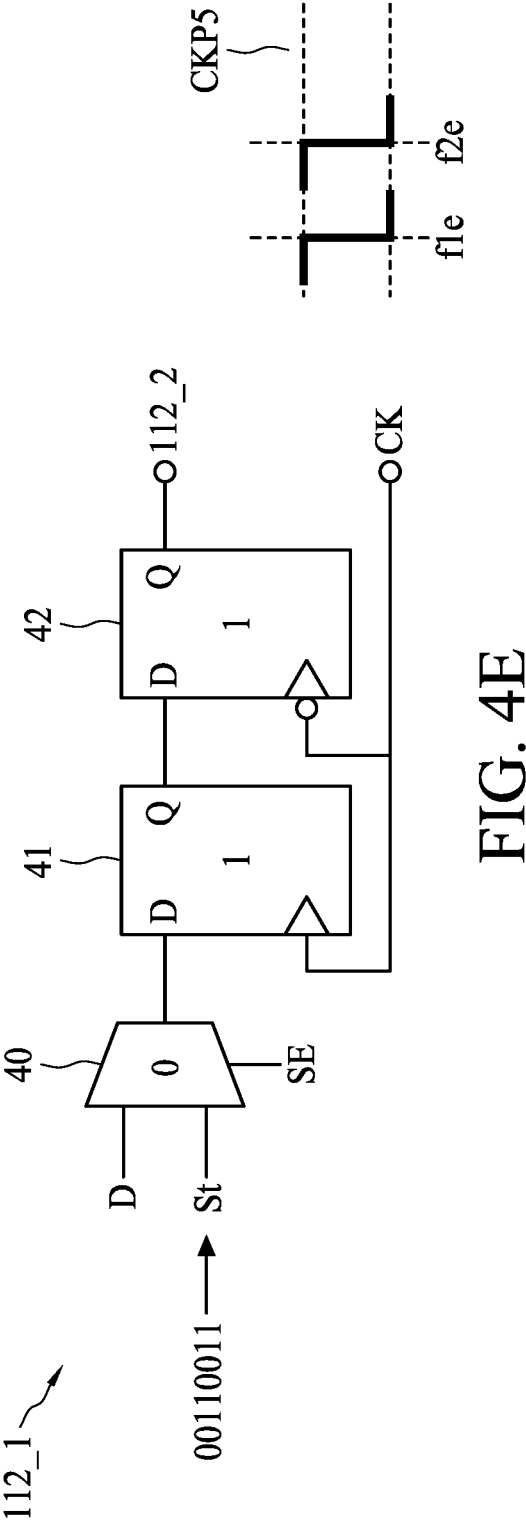

FIG. 4E is a diagram illustrating inputting the second testing signal St2 into the timing circuit 112 in accordance with an embodiment of the present disclosure. Following by the embodiment of FIG. 4A, after the first testing signal St1, whose digital data is [001100], is stored in the flip-flops 112_1 to 112_6, the target circuit under test 110 keeps receiving the testing signal St as the shift signal Sf. At the time point t6, the clock signal CK is transmitted to the timing circuit 112. The clock signal CK has a fifth profile CKP5 including a plurality of half pulses, which is different from the first profile CKP1. Specifically, the fifth profile CKP5 starts with the logic high value then falls to the logic low value, and stops. In other words, the clock signal CK excludes a rising edge in the fifth profile CKP5.

In this embodiment, the latch 42 receives the data bit stored in the latch 41 when the falling edge (e.g., the falling edges f1e or f2e) is received.

It should be noted that, the goal at the time point t6 is to change the data stored in the timing circuit 112, and further change the data transmitted to the combinational logic circuit 114. In the embodiments of FIGS. 4B to 4E, the goal of changing the data stored in the timing circuit 112 is implemented by adjusting the profile of the clock signal CK. Specifically, by inputting the clock signal CK having different profiles into the timing circuit 112, the flip-flops included in the timing circuit 112 store different data. However, those skilled in the art should understand that the clock signal CK can have different profiles to change the data stored in the timing circuit 112 except those shown in FIGS. 4B to 4E. For example, the clock signal CK has a profile which is a combination of the profiles CKP1 to CKP5.

In addition, the testing signal St receives by the timing circuit 112 is not changed at the time point t6 in the embodiments of FIGS. 4B to 4E. The data stored in the timing circuit 112 is changed by changing the profile of the clock signal CK. However, the data stored in the timing circuit 112 can also be changed by inputting different testing signal St into the timing circuit 112. Those skilled in the art should readily understand the implementation of changing the data stored in the timing circuit 112 by changing the testing signal St. The detailed description is omitted here for brevity.

At a time point t7 corresponding to step 214, the power circuit 120 gradually increases the supply power Vdd from the input range (e.g., the normal voltage level Vnom) to the stress range (e.g., the high voltage level Vstress). In the present disclosure, the time period from the time point t6 to the time point t7 is considered as the second input stage 33.

At a time point t8 corresponding to step 216, the power circuit 120 maintains the supply power Vdd in the stress range (e.g., the voltage level Vstress) for the second period tb so as to perform high-voltage testing on the target circuit under test 110. In the present disclosure, the second period tb is also considered as a second stress stage 34.

At a time point t9 corresponding to step 218, the power circuit 120 gradually decreases the supply power Vdd from the stress range (e.g., the high voltage level Vstress) to the off range (e.g., the off voltage level Voff). In one embodiment, the off voltage level Voff is between 0 V and a threshold voltage Vth of a transistor. In another embodiment, the off voltage level Voff is slightly more than the threshold voltage Vth of a transistor.

At a time point t10 corresponding to step 220, the power circuit 120 maintains in the off range (e.g., the off voltage level Voff) for the third period tc. In one embodiment, the third period tc is less than the first period to and the second period tb. In the present disclosure, the third period tc is also considered as an off stage 35.

At a time point t11 corresponding to step 222, the power circuit 120 gradually increases the supply power Vdd from the off range (e.g., the off voltage level Voff) to the stress range (e.g., high voltage level Vstress).

At a time point t12 corresponding to step 224, the power circuit 120 maintains the supply power in the stress range (e.g., the voltage level Vstress) for the fourth period td so as to perform high-voltage testing on the target circuit under test 110. In the present disclosure, the fourth period td is also considered as a third stress stage 36.

At a time point t13 corresponding to step 226, the power circuit 120 gradually decreases the supply power Vdd from the stress range (e.g., the high voltage level Vstress) to 0 V, and ends circuit screening.

In some embodiments of the present disclosure, the length of the first stress stage 32, the second stress stage 34 and the third stress stage 36 is negatively related to the voltage level of the supply power Vdd. In some embodiments of the present disclosure, the length of the first input stage 31 and the second input stage 33 is negatively related to the frequency of the clock signal CK.

Figure 5:
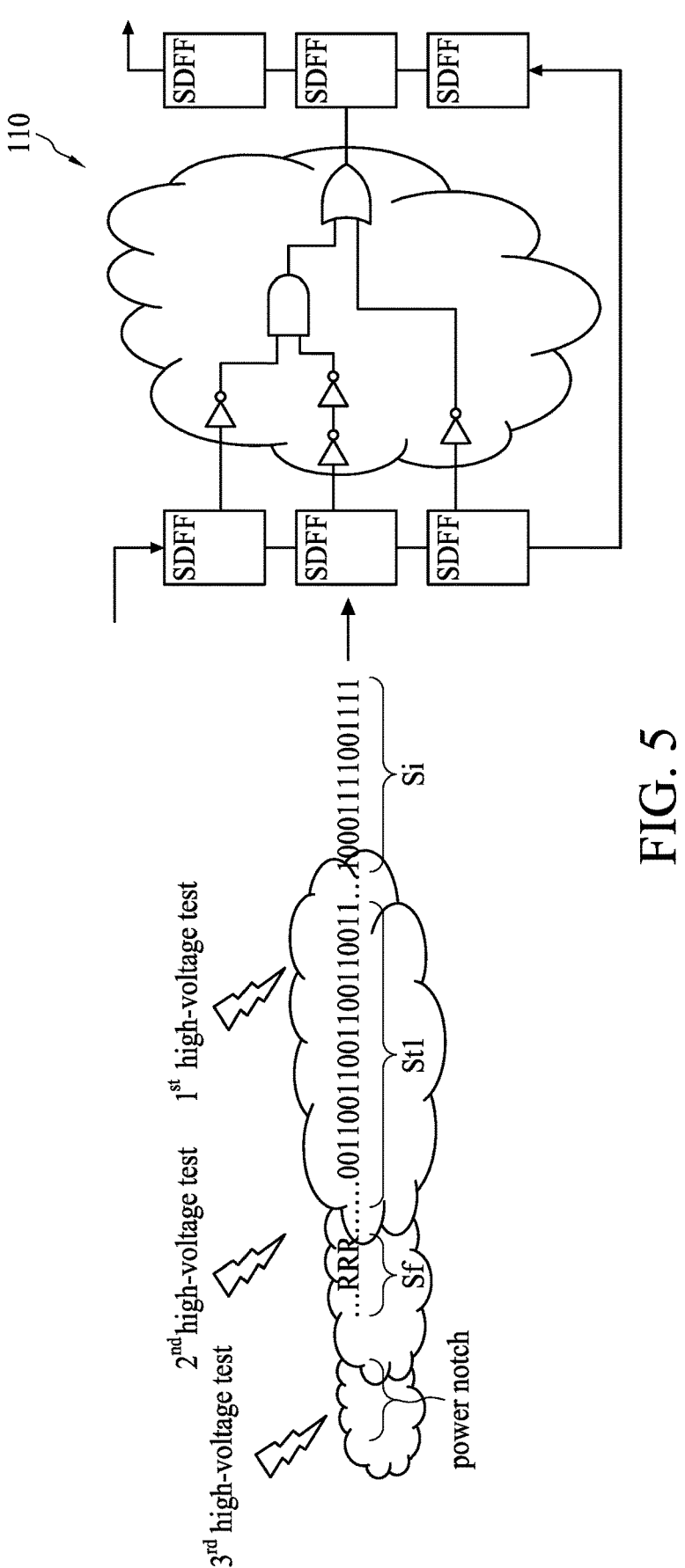
FIG. 5 is a schematic diagram of the circuit screening system inputting testing signals into the target circuit under test according to an embodiment of the present disclosure.

FIG. 5 shows a schematic diagram of the circuit screening system 100 inputting testing signals into the target circuit under test 110 according to an embodiment of the present disclosure. In terms of timing, the initial signal Si (e.g., [10001111001111]) is first inputted into the target circuit under test 110 so as to set the initial states of the circuit components in the target circuit under test 110. Next, at the time point t2, the first testing signal St1 (e.g., [00110011001100110011]) is then inputted into the target circuit under test 110. Once the first testing signal St1 is completely inputted into the target circuit under test 110, at the time point t4, the target circuit under test 110 then undergoes the first high-voltage testing for a period of ta. Once the first high-voltage testing ends, at the time point t6, the shift signal Sf changes the data in the timing circuit 112 to the second testing signal St2. Once the first testing signal St1 is completely changed to the second testing signal St2, at the time point t8, the target circuit under test 110 then performs the second high-voltage testing for a period of tb. Next, at the time point t10, the supply power Vdd of the target circuit under test 110 is pulled down to be close to a turned off state for a short period of time so as to generate a power gap, and then the third high-voltage testing is performed for a period of td.

Furthermore, with the appropriately designed combinational logic circuit 114, when the testing signal changes from the first testing signal St1 to the complementary second testing signal St2, the output voltage levels of all or most of logic circuits in the combinational logic circuit 114 are changed.

Figure 6:
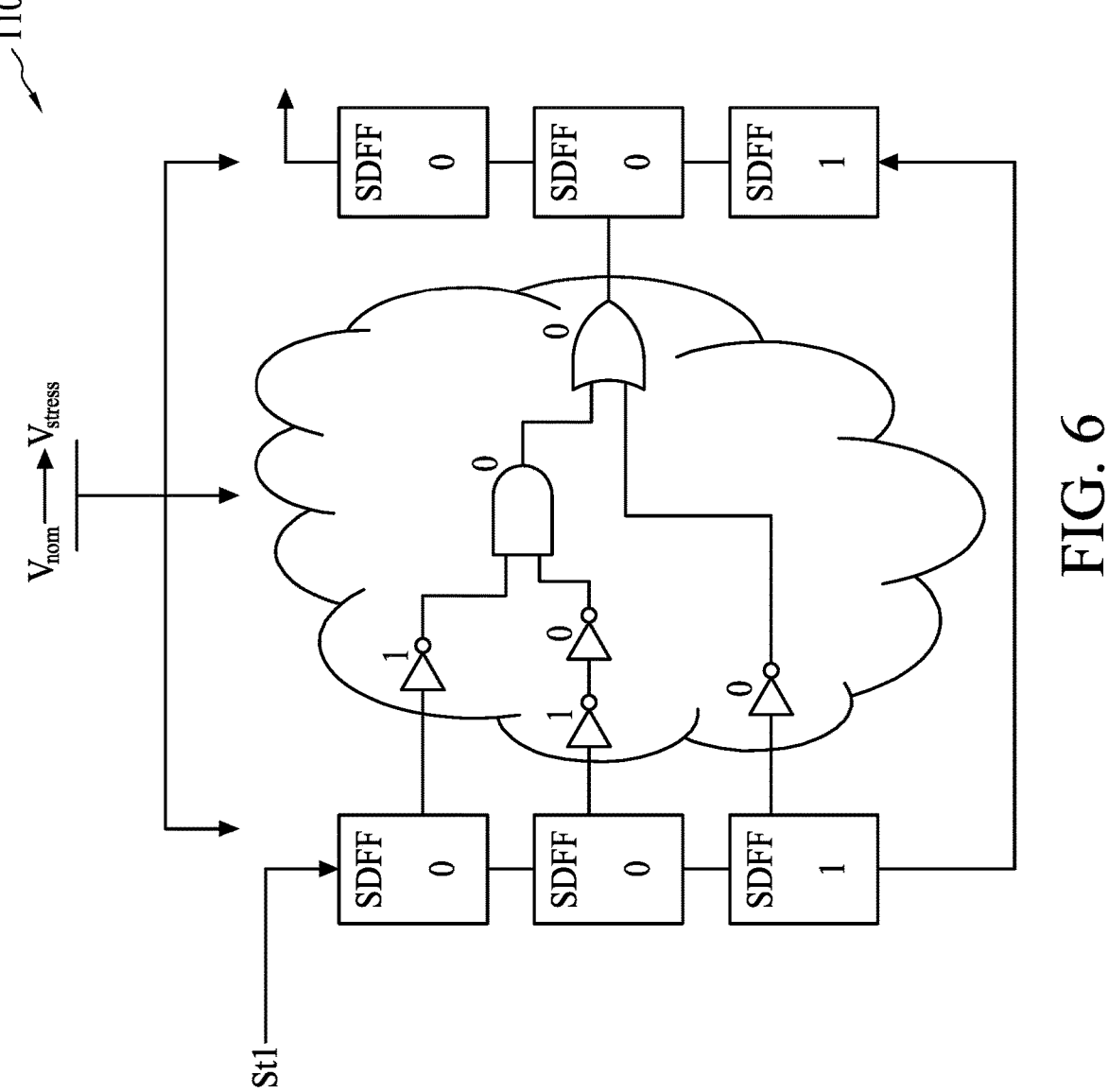
FIG. 6 is a schematic diagram of the target circuit under test in the first high-voltage testing according to an embodiment of the present disclosure.

For example, FIG. 6 shows a schematic diagram of the target circuit under test 110 in the first high-voltage testing according to an embodiment of the present disclosure. For better illustration, the first testing signal St1 is used for description in this embodiment. When the first testing signal St1 is inputted into the timing circuit 112, the output logics of the logic circuits 114_1 to 114_6 are 1, 1, 0, 0, 0 and 0, respectively, wherein logic 1 is a high voltage level and logic 0 is a high voltage level. When the testing signal is the second testing signal St2, the output voltage level of the logic circuit 114_1 is switched to a low voltage level, i.e., logic 0.

Figure 7:
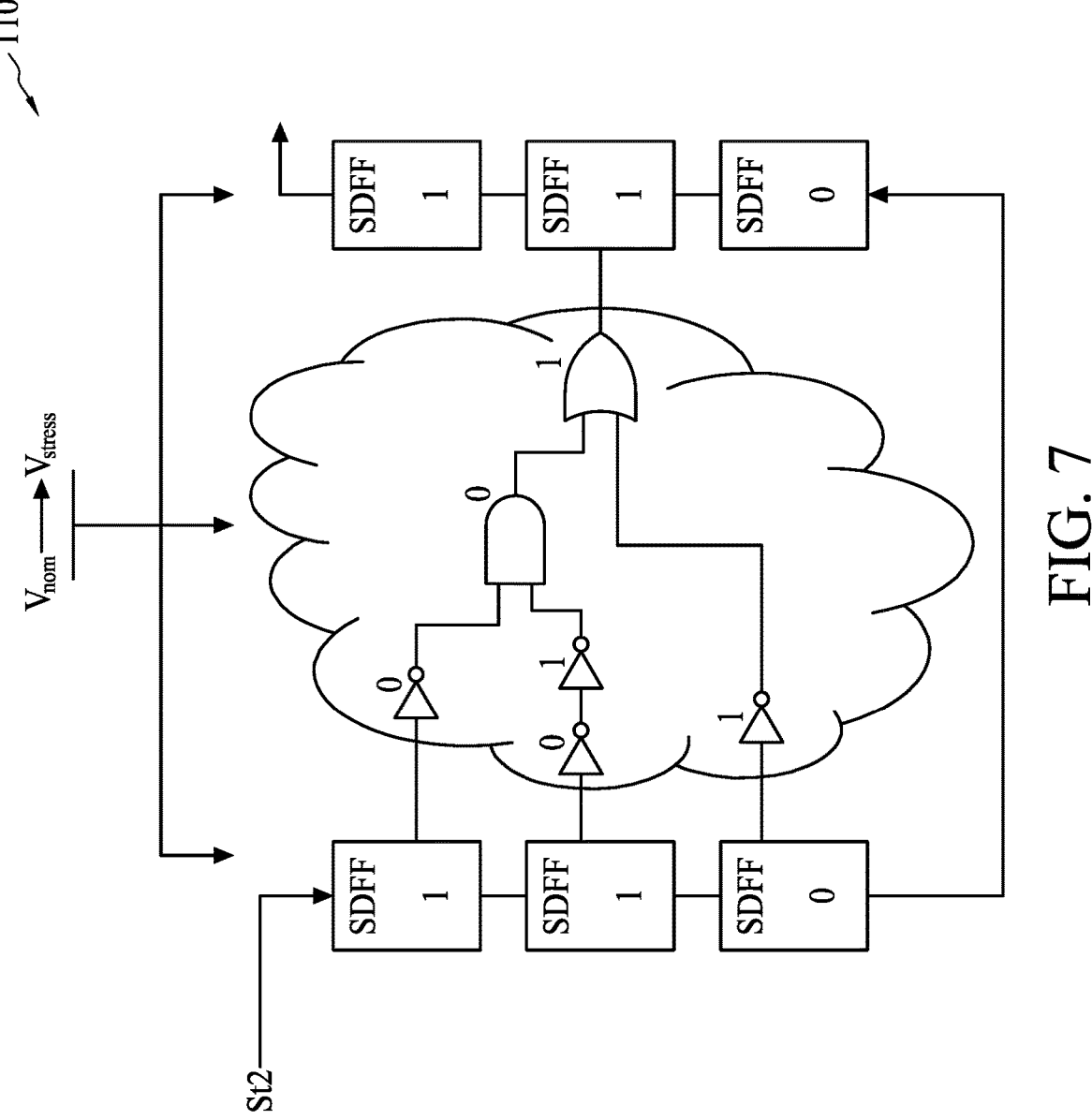
FIG. 7 is a schematic diagram of the target circuit under test in the second high-voltage testing according to an embodiment of the present disclosure.

When the testing signal changes from the first testing signal St1 to the complementary second testing signal St2, i.e., [110011], as shown in FIG. 7 showing a schematic diagram of the target circuit under test 110 in the second high-voltage testing according to an embodiment of the present disclosure, the output logics of the logic circuits 114_1 to 114_6 are 0, 0, 1, 1, 0 and 1, respectively. In other words, except for the logic circuit 114_5, the output voltage levels of the remaining logic circuits have been changed.

Figure 8:
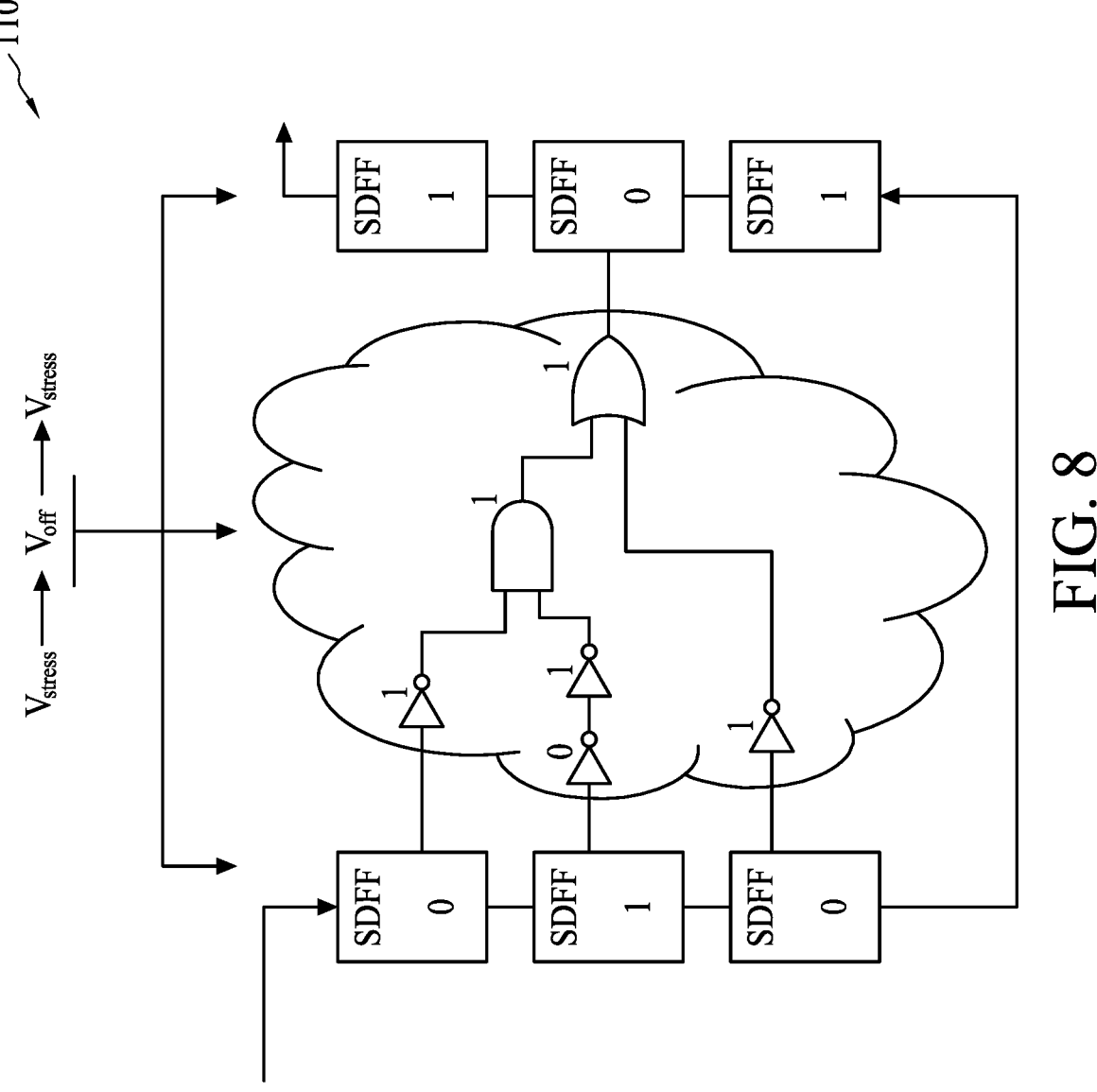
FIG. 8 is a schematic diagram of the target circuit under test in the third high-voltage testing according to an embodiment of the present disclosure.

Once the supply power Vdd of the target circuit under test 110 is pulled down to be close to a turned off state for a short period of time, as shown in FIG. 8 showing a schematic diagram of the target circuit under test 110 in the third high-voltage testing according to an embodiment of the present disclosure, the output logics of the logic circuits 114_1 to 114_6 are 1, 0, 1, 1, 1 and 1, respectively. When the supply power Vdd of the target circuit under test 110 is pulled down to be close to a turned off state for a short period of time, the output voltage level of the logic circuit 114_5 has been changed, i.e., from logic 0 to logic 1. Further, when the supply power Vdd of the target circuit under test 110 is reactivated, the logic values of all circuits in the target circuit under test 110 return to the initial states at the time of powering on. At this point in time, under the first testing signal St1 and the second testing signal St2, for the output voltage level of the logic circuit in the combinational logic circuit 114 that is not changed, the output voltage level is changed when the supply power Vdd is pulled down to be close to a turned off state. It should be noted that, at this point in time, the logics stored in the flip-flops 112_1 to 112_6 are 0, 1, 0, 1, 0 and 1, respectively.

With the circuit screening method 200 above, all the logic circuits 114_1 to 114_6 in the combinational logic circuit 114 in form of different output voltage levels, i.e., logics 0 and 1, can undergo high-voltage testing. Therefore, the circuit screening system 100 of the present disclosure can cover most or all circuit components in the target circuit under test 110, further significantly enhancing screening accuracy. In one embodiment, the screening method of the present disclosure can cover all of the flip-flops 112_1 to 112_6 and one half or more of the logic circuits 114_1 to 114_6 in the target circuit under test 110.

Figure 9:
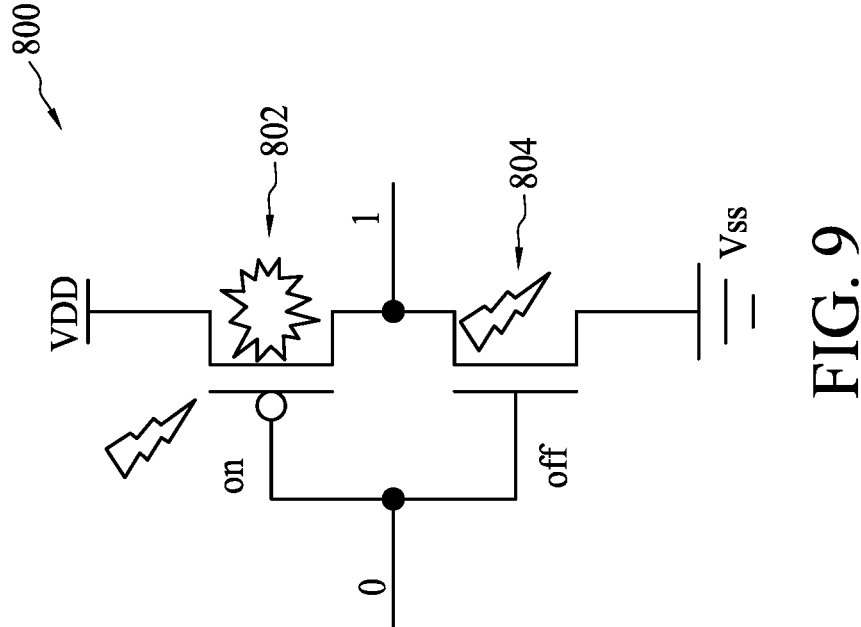
FIG. 9 is a schematic diagram of the target circuit under test according to an embodiment of the present disclosure when the output logic of a functional circuit therein is "1"

FIG. 9 shows a schematic diagram of the target circuit under test 110 according to an embodiment of the present disclosure when the output logic of a functional circuit therein is 1. For better illustration, the functional circuit in this embodiment is exemplified by an inverter 800 (for example, 114_1); however, the present disclosure is not limited to the above. The inverter 800 includes a P-type metal oxide semiconductor field-effect transistor (MOSFET) (hereinafter referred to as a P-type transistor) 802 and an N-type metal oxide semiconductor field-effect transistor (hereinafter referred to as an N-type transistor) 804. The source of the P-type transistor 802 is connected to the supply power Vdd, the gate of the P-type transistor 802 is connected to the gate of the N-type transistor 804, the drain of the P-type transistor 802 is connected to the drain of the N-type transistor 804, and the source of the N-type transistor 804 is connected to a ground voltage Vss. When the input logic of the inverter 800 is 0 and the output logic is 1, the P-type transistor 802 is in a turned on state and the N-type transistor 804 is in an open circuit state. In the first period ta, when the supply power Vdd increases from the normal voltage level Vnom to the high voltage level Vstress so as to perform high-voltage testing on the inverter 800, because the P-type transistor 802 is in a turned on state, even if the source or the drain of the P-type transistor 802 has a defect, the high voltage level Vstress is incapable of screening the defect. Further, the defect may be an extremely short distance between the source and the drain of the P-type transistor 802. However, when the source and the drain of the P-type transistor 802 are electrically connected, the high voltage level Vstress is incapable of generating a higher voltage difference between the source and the drain of the P-type transistor 802, such that the defect cannot be screened.

Figure 10:
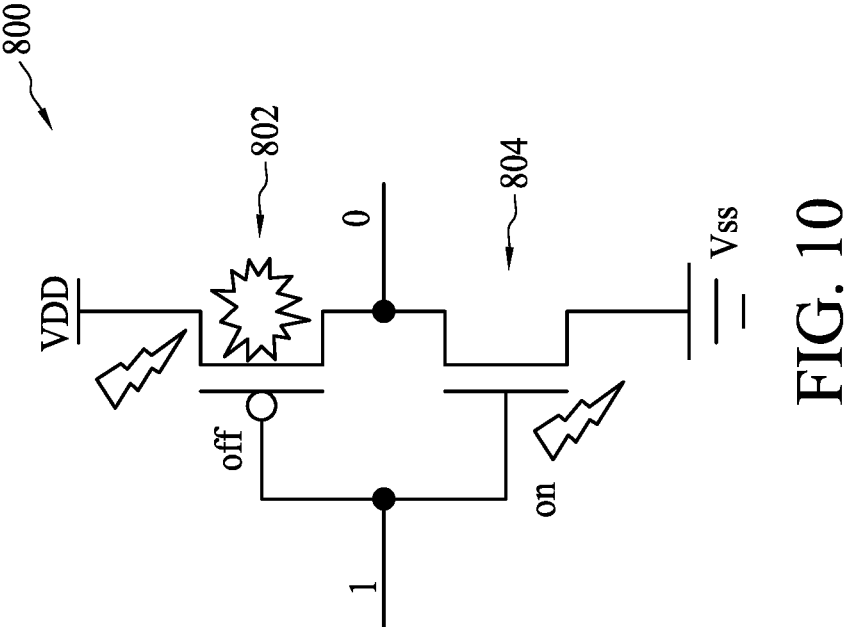
FIG. 10 is a schematic diagram of the target circuit under test according to an embodiment of the present disclosure when the output logic of an inverter therein is "0".

In order to screen the defect of the P-type transistor 802, this embodiment switches the output logic of the inverter 800 to 0 and again performs a high-voltage testing, i.e., the second high-voltage testing. FIG. 10 shows a schematic diagram of the target circuit under test 110 according to an embodiment of the present disclosure when the output logic of the inverter 800 therein is 0. When the input logic of the inverter 800 is 1 and the output logic is 0, the P-type transistor 802 is in an open circuit state, and the N-type transistor 804 is in a turned on state. In the first period tb, when the supply power Vdd increases from the normal voltage level Vnom to the high voltage level Vstress so as to perform high-voltage testing on the inverter 800, because the P-type transistor 802 is in an open circuit state, the source and the drain of the P-type transistor 802 are electrically disconnected. At this point in time, the high voltage level Vstress generates a higher voltage difference between the source and the drain of the P-type transistor 802. If the distance between the source and the drain of the P-type transistor 802 is too short, the voltage difference breaks through the insulation layer between the source and the drain such that the source becomes electrically connected to the drain. In other words, because of the extremely short distance between the source and the drain of the P-type transistor 802, the P-type transistor 802 cannot pass the second high-voltage testing and is thus screened out. It should be noted that, in another embodiment, once the circuit screening method 200 of the present disclosure is complete, a circuit probing method can be used to screen out the P-type transistor 802 with a defect. The circuit probing method inputs a specific signal into the target circuit under test 110 at a normal voltage level Vnom and reads the output signal thereof, and accordingly determines that the transistor with a defect is the P-type transistor 802.

Compared to the current EVS testing method, the quasi-dynamic EVS testing method set forth by the present disclosure is capable of screening most or all circuit components in a target circuit under test, further significantly enhancing screening accuracy. Furthermore, the quasi-dynamic EVS testing method set forth by the present disclosure, in addition to having a shorter testing time, can also use a higher testing voltage for testing, so as to further enhance screening accuracy.

In some embodiments of the present disclosure, a circuit screening system is disclosed. The circuit screening system includes a target circuit under test and a clock generating circuit. The target circuit under test is configured to receive a first testing signal in a first period, and a second testing signal in a second period after the first period. The clock generating circuit is configured to provide a clock signal to the target circuit under test, wherein the clock signal triggers the target circuit under test to receive the first testing signal in the first period and the second testing signal in the second period. The clock signal has a first profile and a second profile in the first period and the second period, respectively, and the first profile and the second profile has a phase difference.

In some embodiments of the present disclosure, a circuit screening system is disclosed. The circuit screening system includes a target circuit under test, a power circuit, and a clock generating circuit. The target circuit under test includes a plurality of flip-flops in cascade connection and a cluster of logic circuits coupled to the flip-flops. The power circuit is configured to provide a supply voltage to the target circuit under test, wherein a voltage level of the supply voltage is located in an input range in a first period, deviates from the input range in a second period after the first period, and located in the input range in a third period after the second period. The clock generating circuit is arranged to provide a clock signal to the target circuit under test. The clock signal has a first profile and a second profile in the first period and the third period, respectively, and the first profile and the second profile has a phase difference.

In some embodiments of the present disclosure, a circuit screening method is disclosed. The method includes operating in a first input stage, in which a first testing signal is inputted into a target circuit under test, and a clock signal having a first profile is provided to the target circuit under test; operating in a second input stage after the first input stage, in which a second testing signal different from the first testing signal is inputted into the test target circuit under test, and a clock signal having a second profile different from the first profile is provided to the target circuit under test; wherein the first profile and the second profile has a phase difference.

The description above is merely preferred embodiments of the present invention, and any equivalent changes and modifications made according to the claims of the present invention are to be encompassed within the scope of the present invention.

What is claimed is:

1. A circuit screening system, comprising:
a target circuit under test, configured to receive a first testing signal in a first period, and a second testing signal in a second period after the first period; and
a clock generating circuit, configured to provide a clock signal to the target circuit under test;
wherein the clock signal has a first profile and a second profile in the first period and the second period, respectively, and the first profile and the second profile has a phase difference;

wherein the phase difference between the first profile and the second profile are 90 degrees.

2. The circuit screening system of claim 1, wherein the clock signal provided in the first period includes a plurality of integrated pulses, and the clock signal provided in the second period includes a plurality of half pulses.

3. The circuit screening system of claim 2, wherein a profile of the clock signal provided in the second period excludes a falling edge.

4. The circuit screening system of claim 2, wherein a profile of the clock signal provided in the second period excludes a rising edge.

5. The circuit screening system of claim 1, further comprising:
a power circuit, configured to provide a supply voltage to the target circuit under test, wherein the supply voltage maintains at a first voltage level in the first period, and deviates from the first voltage level, and then maintains at the first voltage level in the second period.

6. The circuit screening system of claim 5, wherein the supply voltage is pulled up to a second voltage level from the first voltage level and back to the first level after the first period.

7. The circuit screening system of claim 6, wherein the supply voltage is pulled up to the second voltage level from the first voltage level after the second period.

8. A circuit screening system, comprising:
a target circuit under test, including a plurality of flip-flops in cascade connection and a cluster of logic circuits coupled to the flip-flops;
a power circuit, configured to provide a supply voltage to the target circuit under test, wherein a voltage level of the supply voltage is located in an input range in a first period, deviates from the input range in a second period after the first period, and located in the input range in a third period after the second period; and
a clock generating circuit, arranged to provide a clock signal to the target circuit under test;
wherein the clock signal has a first profile and a second profile in the first period and the third period, respectively, and the first profile and the second profile has a phase difference.

9. The circuit screening system of claim 8, further comprising:
a signal generating circuit, arranged to generate a testing signal;
wherein the plurality of flip-flops transfer the testing signal to the cluster of logic circuits.

10. The circuit screening system of claim 8, wherein the clock signal having the first profile includes a plurality of integrated pulses to trigger the plurality of flip-flops to receive the testing signal as a first testing signal in the first period, and the clock signal having the second profile to trigger the plurality of flip-flops to receive the testing signal as a second testing signal in the third period.

11. The circuit screening system of claim 10, wherein the clock signal having the second profile triggers the plurality of flip-flops to shift the first testing signal at least one bit to obtain the second testing signal.

12. The circuit screening system of claim 10, wherein the second testing signal and the second testing signal are complementary.

13. The circuit screening system of claim 10, wherein the testing signal provided by the signal generating circuit in the first period is different from the testing signal provided by the signal generating circuit in the second period.

14. The circuit screening system of claim 8, wherein the voltage level of the supply voltage is located in a stress range higher than the input range in the second period.

15. The circuit screening system of claim 14, wherein the voltage level of the supply voltage is further located in the stress range in a fourth period after the third period, and located in an off range lower than the input range in a fifth period after the fourth period.

16. The circuit screening system of claim 15, wherein the voltage level of the supply voltage is further located in the stress range in a sixth period after the fifth period.

17. The circuit screening system of claim 15, wherein the voltage level located in the off range smaller than a threshold voltage of a transistor of the target circuit under test.

18. A circuit screening method, comprising:

operating in a first input stage, in which a first testing signal is inputted into a target circuit under test, and a clock signal having a first profile is provided to the target circuit under test;

operating in a second input stage after the first input stage, in which a second testing signal different from the first testing signal is inputted into the test target circuit under test, and a clock signal having a second profile different from the first profile is provided to the target circuit under test;

wherein the first profile and the second profile has a phase difference;

wherein in the first input stage and the second input stage, a supply voltage, whose voltage level locates in an input range, is provided to the target circuit under test, and the circuit screening method further comprises:

operating in a first stress stage after the first input stage, in which the voltage level of the supply voltage locates in a stress range higher than the input range.

19. The circuit screening method of claim 18, wherein operating in the second input stage after the first stress stage further comprising:

generating the clock signal having the second profile by generating a logic low value, rising the logic low value to a logic high value, stopping generating the clock signal; and inputting the second signal having the second profile to the target circuit under test.

20. The circuit screening method of claim 18, further comprising:

operating in an off stage after the second input stage, in which the supply voltage, whose voltage level locates in an off range lower than the input range, is provided to the test target circuit under test.

\* \* \* \* \*